United States Patent
Hao (10) Patent No.: US 10,790,311 B2
(45) Date of Patent: Sep. 29, 2020

(54) DISPLAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Sikun Hao, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 160 days.

(21) Appl. No.: 16/169,167

(22) Filed: Oct. 24, 2018

(65) Prior Publication Data

US 2019/0229129 A1 Jul. 25, 2019

Related U.S. Application Data

(63) Continuation of application No. PCT/CN2018/075118, filed on Feb. 2, 2018.

(30) Foreign Application Priority Data

Jan. 22, 2018 (CN) .......................... 2018 1 0061755

(51) Int. Cl.
*H01L 27/12* (2006.01)
*G02F 1/1362* (2006.01)
*G02F 1/1368* (2006.01)
*G02F 1/1335* (2006.01)
(Continued)

(52) U.S. Cl.
CPC .......... *H01L 27/124* (2013.01); *G02F 1/1368* (2013.01); *G02F 1/133512* (2013.01); *G02F 1/133514* (2013.01); *G02F 1/136286* (2013.01); *H01L 29/41733* (2013.01); *H01L 29/42384* (2013.01); *G02F 2201/123* (2013.01); *G02F 2201/40* (2013.01)

(58) Field of Classification Search
None
See application file for complete search history.

(56) References Cited

U.S. PATENT DOCUMENTS

| 2004/0085278 | A1 | 5/2004 | Chae et al. |
| 2004/0266041 | A1* | 12/2004 | Kim .................... H01L 27/12 438/30 |
| 2005/0184389 | A1* | 8/2005 | Chen .................... H01L 27/124 257/737 |

FOREIGN PATENT DOCUMENTS

| CN | 101246290 A | 8/2008 |
| CN | 102364387 A | 2/2012 |
| CN | 203422543 U | 2/2014 |

(Continued)

*Primary Examiner* — Raj R Gupta
(74) *Attorney, Agent, or Firm* — Leong C. Lei (57) ABSTRACT

The present disclosure relates to a display substrate. The display substrate includes a substrate, a plurality of thin film transistors (TFTs), and data lines. Each of the TFT includes a gate electrode configured on different layer with the data line. A projection of the gate electrode on a plane partially overlaps with the data lines, wherein the data lines are arranged on the plane. A portion of an orthogonal projection of the gate electrode on the plane is arranged on one side of the data line, wherein the portion is not overlapped by the data lines, and the data lines are arranged on the plane.

8 Claims, 5 Drawing Sheets

(51) Int. Cl.
*H01L 29/417* (2006.01)
*H01L 29/423* (2006.01)

(56) References Cited

FOREIGN PATENT DOCUMENTS

| CN | 106960881 A | * | 7/2017 |
|----|-------------|---|--------|
| CN | 106960881 A |   | 7/2017 |
| CN | 107132710 A |   | 9/2017 |

* cited by examiner

DISPLAY SUBSTRATE

CROSS REFERENCE TO RELATED APPLICATIONS

This application is a continuing application of PCT Patent Application No. PCT/CN2018/075118 entitled "DISPLAY SUBSTRATE", filed on Feb. 2, 2018, which claims priority to Chinese Patent Application No. 201810061755.0, filed on Jan. 22, 2018, both of which are hereby incorporated in its entireties by reference.

BACKGROUND

1. Technical Field

The present disclosure relates to display technology field, and more particularly to a display substrate.

2. Description of Related Art

Thin film transistors (TFTs) have been widely used as switching elements of display substrates, such as liquid crystal display substrates or organic light emitting display substrates. In the TFT substrate, the scanning lines are arranged in the horizontal direction, and the data lines are arranged in the vertical direction to cross the scanning lines. The pixel area is defined by the intersection between the scanning lines and the data lines.

As the demand for the resolution of the display substrate increases, the number of pixels of the display substrate also increases. In addition, the number of TFTs also increases. In a limited space, the aperture ratio of the display substrate may be reduced due to the increasing number of TFTs.

SUMMARY

The present disclosure relates to a display substrate to enhance the aperture rate of the TFT substrate.

In one aspect, a display substrate includes: a substrate, a plurality of thin film transistors (TFTs), and data lines, each of the TFT comprising a gate electrode configured on different layer with the data line, a projection of the gate electrode on a plane partially overlapping with the data lines, wherein the data lines are arranged on the plane, and a portion of an orthogonal projection of the gate electrode on the plane is arranged on one side of the data line, wherein the portion is not overlapped by the data lines, and the data lines are arranged on the plane.

Wherein the TFT also includes a source electrode and a drain electrode spaced apart from each other, the source electrode and the drain electrode are configured on the same layer with the data line, the source electrode electrically connects to a pixel electrode, and the drain electrode partially overlaps with the data line, and an orthogonal projection of an overlapping area of the drain electrode and the data line on the plane is within the gate electrode, wherein the gate electrode is arranged on the plane.

Wherein the data line includes a first extension segment and a second extension segment connected at an angle, the drain electrode includes a first connection section, a bending section, and a second connection section been sequentially connected, the first connection section partially overlaps with the first extension segment, the bending section partially overlaps with the second extension section, the second connection section and the first connection section are arranged on the same side of the second extension section, and the second connection section extends away from the second extension section.

Wherein the first extension section includes a first edge, a projection of the gate electrode on the plane where the data line being arranged is on one side of the first edge, the gate electrode includes a second edge, projections of the first edge and the second edge on the plane where the data line being arranged are at least partially overlapped.

Wherein the second extension segment includes a third edge, a projection of the gate electrode on the plane where the data line is located on is at one side of the third edge, the gate electrode includes a fourth edge, projections of the third edge and the fourth edge on the plane where the data line is arranged are at least partially overlapped.

Wherein the source electrode includes an elongated section, a gap is formed between the first connection section and the second connection section, the gap is exterior to the data line, an elongated section extends into the gap between the first connection section and the second connection section.

Wherein the display substrate further includes a first pixel electrode disposed on a side of the TFT away from the substrate, and covers the TFT, and the data line.

Wherein the display substrate further includes a plurality of scanning lines parallel to each other, and a plurality of data lines parallel to each other, the data lines intersect with the scanning lines to define a plurality of pixel areas, the TFT is configured within the pixel area; the display substrate further includes a color film (CF) substrate covering the pixel areas, and the first pixel electrode is arranged on the CF substrate.

Wherein the display substrate further includes a second pixel electrode spaced apart from the first pixel electrode, the second pixel electrode is arranged on the CF substrate, and the pixel area includes an opening area located at one side of the TFT, and the second pixel electrode covers the opening area.

Wherein the CF substrate is provided with an opening facing toward the source electrode, and the second pixel electrode electrically connects with the source electrode via the opening.

In view of the above, the display substrate includes the TFT and the data line disposed on the substrate. The gate electrode and the data line of the TFT are stacked in the direction "z" perpendicular to the substrate. Compared to the configuration wherein the gate electrode and the data line of the TFT are arranged side by side and are spaced from each other in the direction of the gate electrode to the data line, the dimension occupied by the gate electrode and the data line is reduced. When the TFT is provided within the pixel area formed by the data line and the scan line, the dimension occupied by the TFT reduced, which increases the dimension of the opening area in the pixel area. Thus, the aperture ratio of the display substrate is increased.

DETAILED DESCRIPTION

Following embodiments of the invention will now be described in detail hereinafter with reference to the accompanying drawings.

In order to more clearly understand the above objects, features, and advantages of the present disclosure, the present disclosure will be described in detail below in conjunction with the accompanying drawings and specific embodiments. It should be noted that the embodiments of the present disclosure and the features in the embodiments can be combined with each other without conflict.

In the following description, numerous specific details are set forth in order to provide a thorough understanding of the present disclosure, and the described embodiments are merely a part of the embodiments of the present disclosure. Based on the implementation in the present disclosure, all other implementations obtained by those skilled in the art without making creative efforts shall fall within the protection scope of the present disclosure.

In addition, the following description of various embodiments is provided with reference to additional drawings to exemplify particular embodiments in which the present disclosure may be implemented. The directional terms mentioned in the present disclosure, for example, "length", "width", "thickness", etc., are merely referring to the directions of the attached drawings. Therefore, the directional terms used are for better and clearer explanations. The understanding of this disclosure does not indicate or imply that the device or element referred to must have a particular orientation, be constructed and operated in a particular orientation, and therefore should not be construed as a limitation of the present application.

Figure 1:
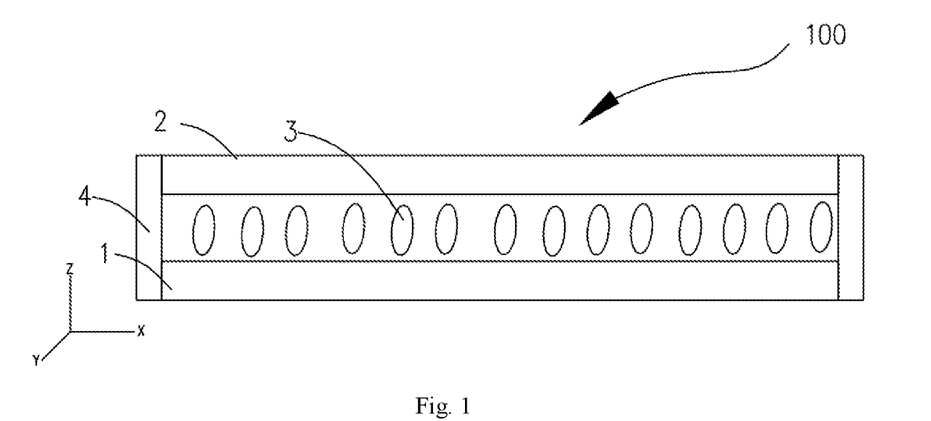
FIG. 1 is a schematic view of the TFT substrate in accordance with one embodiment of the present disclosure.

FIG. 1 is a schematic view of the TFT substrate in accordance with one embodiment of the present disclosure. The display substrate 100 includes a TFT substrate 1, a color film (CF) substrate 2, and a liquid crystal layer 3 between the TFT substrate 1 and the CF substrate 2. The TFT substrate 1 aligns with the CF substrate 2, and the TFT substrate 1 and the CF substrate 2 are fixed by a plastic frame 4 so as to fix the liquid crystal layer 3 between the TFT substrate 1 and the CF substrate 2.

Figure 2:
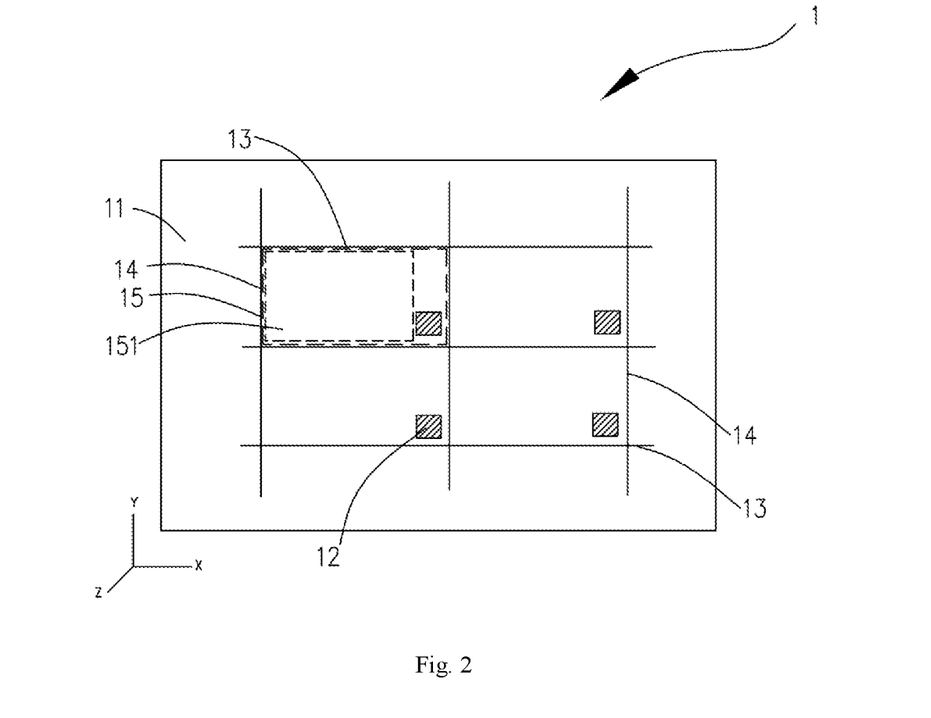
FIG. 2 is a plan view of the TFT substrate in FIG. 1.
Figure 3:
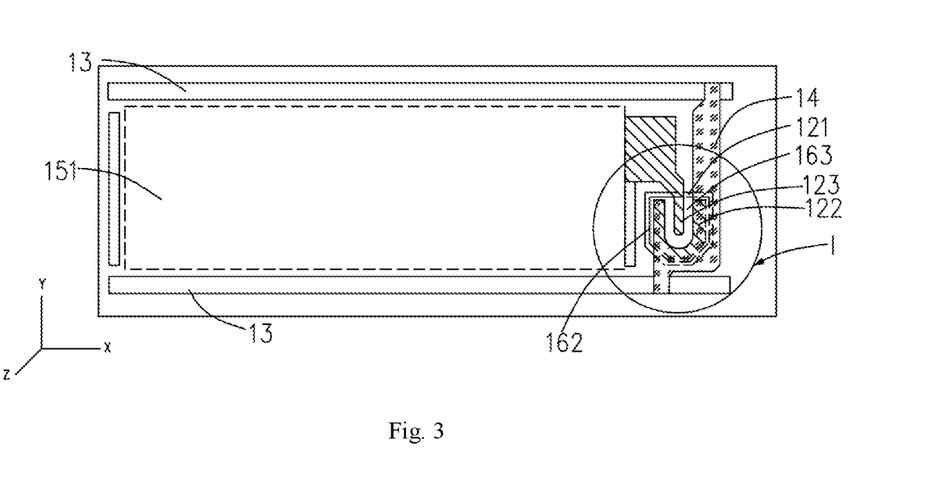
FIG. 3 is a partial schematic view of one pixel area of the TFT substrate in FIG. 2.
Figure 4:
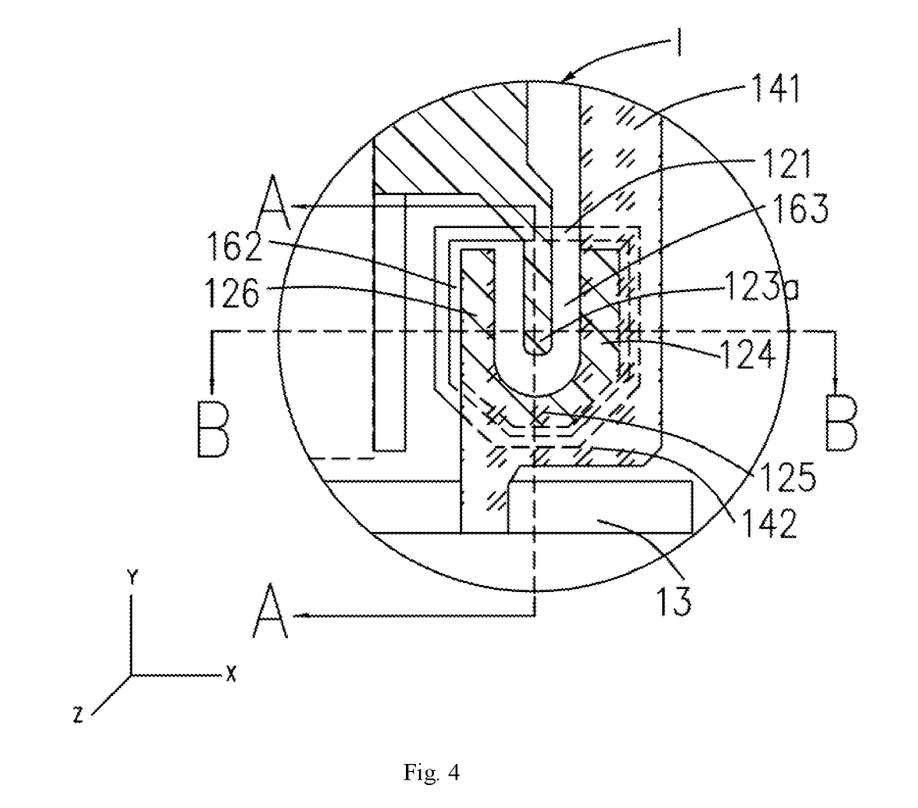
FIG. 4 is an enlarged view of the pixel area in FIG. 3.

Referring to FIG. 2, the TFT substrate 1 includes a substrate 11, a plurality of TFTs 12, a plurality of scanning lines 13 parallel to each other, and a plurality of data lines 14 parallel to each other. The data lines 14 intersect with the scanning lines 13 to define a plurality of pixel areas 15. An extension direction of the data lines 14 is perpendicular to the extension directions of the scanning lines 13. Two adjacent data lines 14 and two scanning lines 13 cooperatively define the rectangular pixel area 15. The TFT 12 is configured within the pixel area 15. A region other than the TFT 12 in the pixel region 15 is an open area 151, and the open area 151 is configured for transmissive light and display. Referring to FIGS. 3 and 4, the TFT 12 includes a gate electrode 121, a drain electrode 122, and a source electrode 123. The gate electrode 121 of the TFT 12 electrically connects to the scanning lines 13, and the drain electrode 122 of the TFT 12 electrically connects to the data lines 14. The gate electrode 121 of the TFT 12 and the scanning lines 13 may be on the same layer, such as the layer contacting with the substrate 11. The drain electrode 122 of the TFT 12 and the data lines 14 may be one the same layer, such as the film layer above the gate electrode 121 and the scanning lines 13. An insulation layer 161 is configured between the layer where the gate electrode 121 and the scanning lines 13 are disposed on and the layer where the drain electrode 122 and the data lines 14 are disposed on such that the data lines 14 and the scanning lines 13 are insulated from each other. An active layer 162 is configured between the insulation layer 161 and the drain electrode 122 such that a trench is formed between the source electrode 123 and the drain electrode 122. The scanning lines 13 are configured to turn on/off the TFT 12, and the data lines 14 are configured to input electrical signals to the TFT 12.

Figure 5:
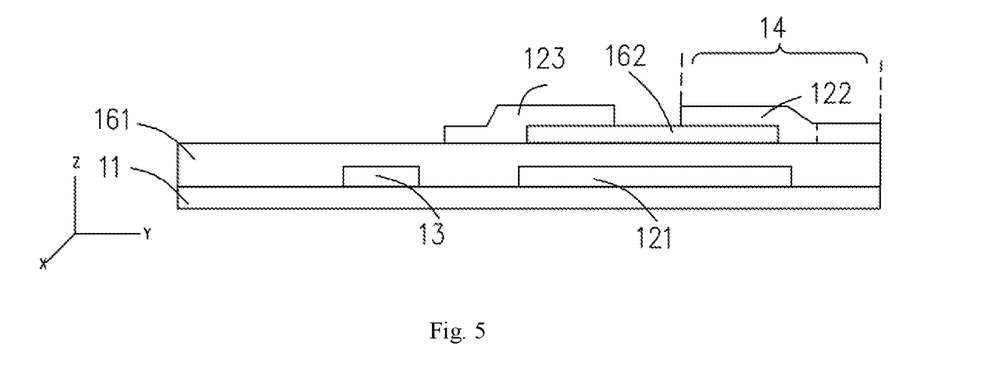
FIG. 5 is a cross-sectional view of the pixel area in FIG. 4 along the "A-A" line.
Figure 6:
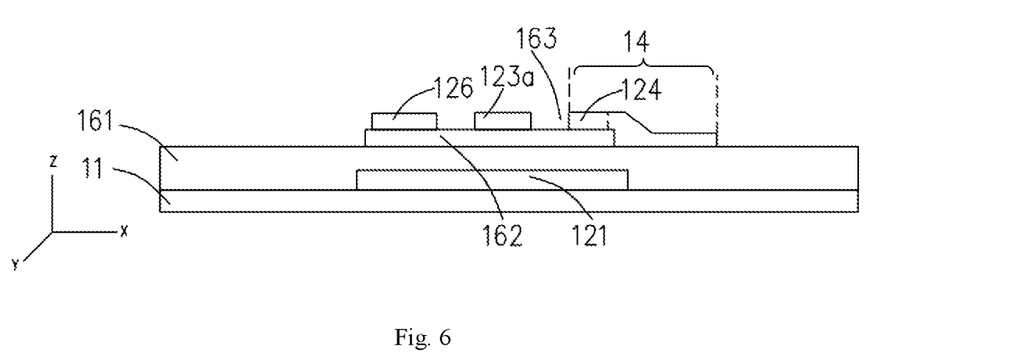
FIG. 6 is a cross-sectional view of the pixel area in FIG. 4 along the "B-B" line.

Referring to FIGS. 5 and 6, the gate electrode 121 and the data lines 14 are on different layers, and an orthogonal projection of the gate electrode 121 on the plane where the data lines 14 are arranged is partially overlapped with the data lines 14. A portion of the gate electrode 121 not being overlapped by the data line 14 is arranged on one side of the data line 14. In other words, the gate electrode 121 and the data lines 14 are stacked along a direction perpendicular to the substrate 11, i.e., a first direction "z." In addition, with respect to a second direction "x", an edge 12a of the gate electrode 121 has not exceeded a border 14a of the data lines 14 facing away the gate electrode 121. The second direction "x" is the direction from the gate electrode 121 toward the data lines 14.

By stacking the gate electrode 121 of the TFT 12 and the data lines 14 along the first direction "z", which is perpendicular to the substrate, a dimension occupied by the gate electrode 121 and the data lines 14 along the second direction "x" is reduced. By overlapping the TFT 12 and the borer of the pixel area 15, the dimension within the pixel area 15 occupied by the TFT 12 may be saved, which increases the dimension of the open area 151 of the pixel area 15. As such, the aperture ratio of the TFT substrate may be increased. This not only enhances the transmittance rate of the TFT substrate, but also enhances the display performance of the display substrate 100.

Referring to FIG. 4, the source electrode 123 of the TFT 12 is spaced apart from the drain electrode 122 of the TFT 12. In addition, the source electrode 123, the drain electrode 122, and the data lines 14 are on the same layer. The source electrode 123 electrically connects to the pixel electrode. The drain electrode 122 electrically connects to the data lines 14, and the drain electrode 122 partially overlaps with the data lines 14, which means that the drain electrode 122 connects to the data lines 14, and a portion of the data lines 14 operate as the drain electrode 122 facing toward the gate electrode 121. In this way, the multiplexing of the drain electrode 122 and the data line 14 can be realized, and the size of the drain electrode 122 and the data line 14 in the second direction "x" can be reduced, so that the TFT 12 and the data line 14 can be stacked. The arrangement of the TFT 12 and the data line 14 may be more compact, and the space occupied by the TFT 12 in the pixel area 15 is reduced. The aperture ratio of the pixel area 15 is increased, and the manufacturing cost of the drain electrode 122 and the data line 14 is also reduced.

In an example, the data lines 14 and the scanning lines 13 may be straight lines, or may be a plurality of bent line segments.

In an embodiment, referring to FIG. 4, in order to increase the light transmittance of the TFT substrate 11, the data line 14 is formed by a plurality of bent line segments. The data line 14 includes a first extension segment 141 and a second extension segment 142 connected at an angle. Within one pixel region 15, the data line 14 includes a first extension segment 141 and a second extension segment 142, and an extension direction of the first extension segment 141 and the extension direction of the second extension segment 142 are substantially perpendicular.

Further, referring to FIG. 4, the drain electrode 122 includes a first connection section 124, a bending section 125, and a second connection section 126 that are sequentially connected. The second connection section 126 and the first connection section 124 are disposed on the same side of the second extension section 142, and the second connection section 126 extends away from the second extension section 142. The drain electrode 122 is C-shaped or U-shaped when viewed in a direction perpendicular to the substrate 11. The first connection section 124 and the second connection section 126 are opposite and spaced apart, and the bending section 125 is connected between the first connection section 124 and the second connection section 126. The first connection segment 124 partially overlaps with the first extension segment 141. The bending section 125 partially overlaps with the second extension section 142. That is, the drain electrode 122 and the data line 14 partially overlap at the connection between the first extension segment 141 and the second extension segment 142. The drain electrode 122 and the data line 14 partially overlaps in the second direction "x", and also partially overlaps in the third direction "y", i.e., a direction from the drain electrode 122 to the second extension segment 142. As such, the overlapping area of the drain electrode 122 and the data line 14 can be increased. The multiplexing area of the drain electrode 122 and the data line 14 makes the arrangement of the TFT 12 and the data line 14 more compact, further increases the aperture ratio of the pixel region 15. In addition the manufacturing cost of the drain electrode 122 and the data line 14 may be reduced.

Figure 7:
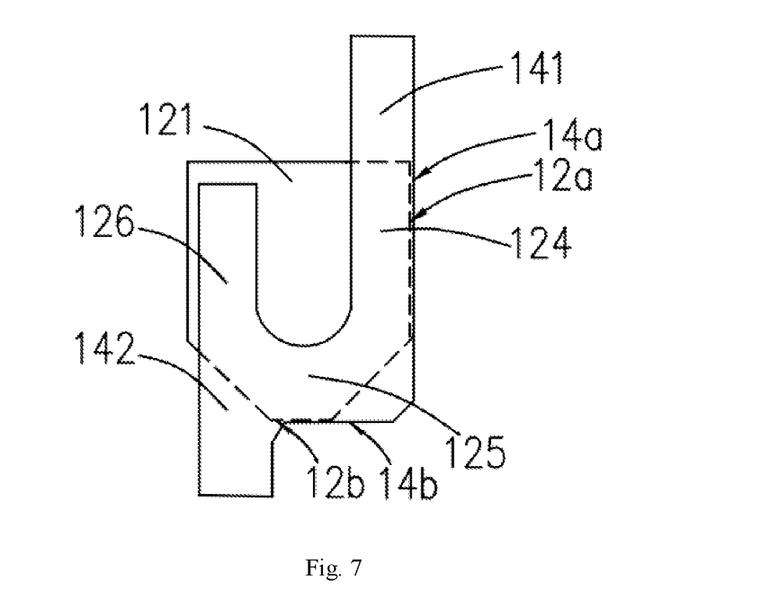
FIG. 7 is a partial schematic view of the pixel area in FIG. 4.

Further, referring to FIG. 7, when viewed from a direction perpendicular to the substrate 11, the first extension section 141 has a first edge 14*a*. The projection of the gate electrode 121 on the plane of the data line 14 is located on one side of the first edge 14*a*. The first edge 14*a* of the first extension segment 141 is the farthest away from the gate electrode 121 in the second direction x. The gate electrode 121 does not exceed the first edge 14*a*. The gate electrode 121 has a second edge 12*a*. The projections of the first edge 14*a* and the second edge 12*a* at least partially overlap on the plane where the data lines 14 being arranged. That is, in the direction perpendicular to the substrate 11, the first edge 14*a* and the second edge 12*a* overlap at least partially, so that the overlapping area of the TFT 12 and the data line 14 in the second direction x is the largest. In this way the multiplexing area of the TFT 12 and the data line 14 is further increased, and the arrangement of the TFT 12 and the data line 14 is more compact. The aperture ratio of the pixel region 15 is further increased, and the manufacturing cost of the drain electrode 122 and the data line 14 is further reduced.

Further, referring to FIG. 7, the second extension segment 142 has a third edge 14*b* as viewed in a direction perpendicular to the substrate 11. The projection of the gate electrode 121 on the plane of the data line 14 is located on one side of the third edge 14*b*. The third edge 14*b* is the farthest away from the gate electrode 12 in the second direction x. The gate electrode 121 does not exceed the third edge 14*b*. The gate electrode 121 has a fourth edge 12*b*. The projections of the third edge 14*b* and the fourth edge 12*b* on the plane of the data line 14 at least partially overlap. That is, in the direction perpendicular to the substrate 11, the third edge 14*b* and the fourth edge 12*b* overlap at least partially, so that the overlapping area of the TFT 12 and the data line 14 in the third direction y is the largest. Thus, the multiplexing area of the drain electrode 122 and the data line 14 is further increased. The arrangement of the TFT 12 and the data line 14 is more compact, and the aperture ratio of the pixel region 15 is further increased. The production cost of the drain electrode 122 and the data line 14 is further reduced.

In this embodiment, referring to FIG. 4, the source electrode 123 includes an elongated section 123*a*. A gap 162 is formed between the first connection section 124 and the second connection section 126. The gap 162 is exterior to the data line 14. The elongated section 123*a* extends into the gap 162 between the first connection section 124 and the second connection section 126. In a direction perpendicular to the substrate 11, the elongated section 123*a* faces toward the gate electrode 121.

Figure 8:
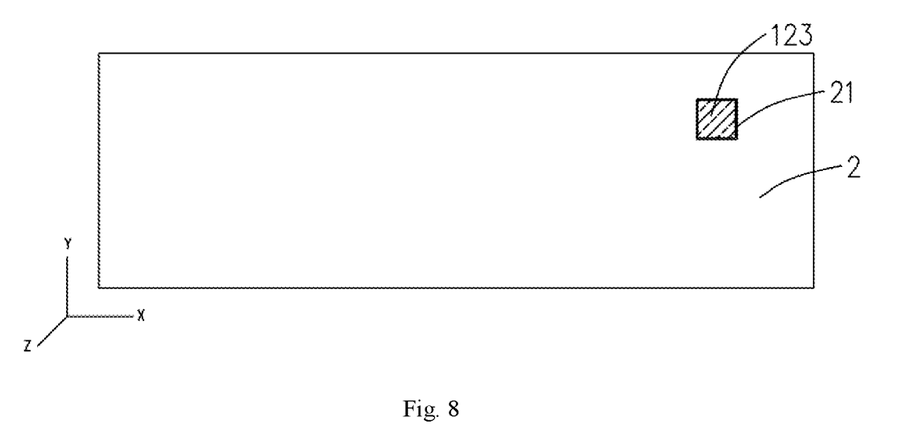
FIG. 8 is a schematic view of the TFT substrate in accordance with another embodiment of the present disclosure.

Referring to FIG. 8, the CF substrate 112 includes color blocks for displaying red, green, and blue primary colors of a color image. In one pixel area 15, the CF substrate 2 is provided with an opening 21 facing toward the source electrode 123.

Figure 9:
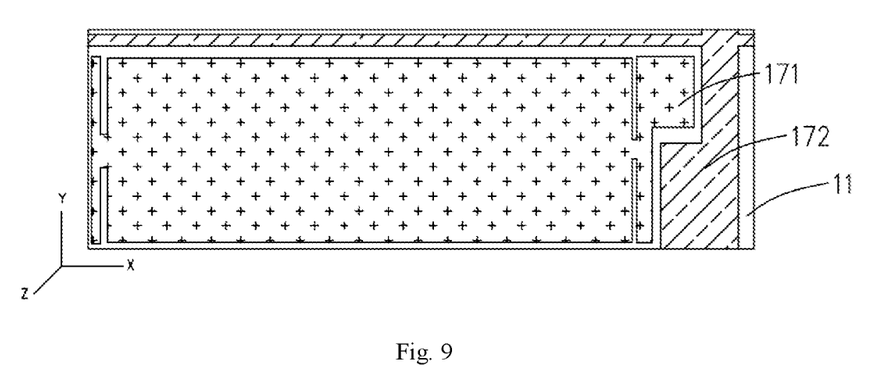
FIG. 9 is a schematic view of the TFT substrate in accordance with another embodiment of the present disclosure.

In an embodiment, referring to FIG. 9, the display substrate 100 further includes a first pixel electrode 172 disposed on the CF substrate 2. The first pixel electrode 172 is disposed on a side of the TFT 12 away from the substrate 11, and covers the TFT 12, the data line 14, and the scanning line 13. In this embodiment, the pixel electrode covering the opening area 151 is the second pixel electrode 171. The first pixel electrode 172 and the second pixel electrode 171 are spaced apart from each other. The first pixel electrode 172 and the second pixel electrode 171 are on the same layer and can be formed using the same material and in the same process.

Further, the display substrate 100 further includes a black matrix (not shown), the black matrix covers the data line 14 and the TFT 12, and exposes the second pixel electrode 171. The area other than the black matrix is the aperture ratio of the pixel area 15. In this embodiment, the data lines 14 and TFTs 12 are stacked, so that the data lines 14 and the TFTs 12 are arranged compactly, and the space occupied by the data lines 14 and the TFTs 12 is reduced, i.e., the area of the black matrix is reduced. The aperture ratio of the pixel region 15 increases the light transmittance of the TFT substrate 11.

The display substrate 100 provided includes the TFT 12 and the data line 14 disposed on the substrate 11, i.e., the gate electrode 121 and the data line 14 of the TFT 12 are stacked in the direction z perpendicular to the substrate 11. Compared to the configuration wherein the gate electrode 121 and the data line 14 of the TFT 12 are arranged side by side and are spaced from each other in the direction of the gate electrode 121 to the data line 14, the dimension occupied by the gate electrode 121 and the data line 14 is reduced. When the TFT 12 is provided within the pixel area 15 formed by the data line 14 and the scan line 13, the dimension occupied by the TFT 12 reduced, which increases the dimension of the opening area 151 in the pixel area 15. Thus, the aperture ratio of the display substrate 100 is increased.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A display substrate, comprising:

a substrate, a plurality of thin film transistors (TFTs), and data lines, each of the TFT comprising a gate electrode configured on different layer with the data line, an orthogonal projection of the gate electrode on a plane where the data line is arranged partially overlapping with the data lines, and a portion of an orthogonal projection of the gate electrode on the plane is arranged on one side of the data line, wherein the portion is not overlapped by the data lines;

wherein the TFT also comprises a source electrode and a drain electrode spaced apart from each other, the source electrode and the drain electrode are configured on the same layer with the data line, the source electrode electrically connects to a pixel electrode, and the drain electrode partially overlaps with the data line, and an orthogonal projection of an overlapping area of the drain electrode and the data line on a plane where the gate electrode is arranged is within the gate electrode;

wherein the data line comprises a first extension segment and a second extension segment connected at an angle, the drain electrode comprises a first connection section, a bending section, and a second connection section ben sequentially connected, the first connection section partially overlaps with the first extension segment, the bending section partially overlaps with the second extension section, the second connection section and the first connection section are arranged on the same side of the second extension section, and the second connection section extends away from the second extension section.

2. The display substrate as claimed in claim 1, wherein the first extension section comprises a first edge, a projection of the gate electrode on the plane where the data line being arranged is on one side of the first edge, the gate electrode comprises a second edge, projections of the first edge and the second edge on the plane where the data line being arranged are at least partially overlapped.

3. The display substrate as claimed in claim 1, wherein the second extension segment comprises a third edge, a projection of the gate electrode on the plane where the data line is located on is at one side of the third edge, the gate electrode comprises a fourth edge, projections of the third edge and the fourth edge on the plane where the data line is arranged are at least partially overlapped.

4. The display substrate as claimed in claim 1, wherein the source electrode comprises an elongated section, a gap is formed between the first connection section and the second connection section, the gap is exterior to the data line, an elongated section extends into the gap between the first connection section and the second connection section.

5. The display substrate as claimed in claim 1, wherein the pixel electrode is disposed on a side of the TFT away from the substrate, and covers the TFT, and the data line.

6. The display substrate as claimed in claim 5, wherein the display substrate further comprises a plurality of scanning lines parallel to each other, and a plurality of data lines parallel to each other, the data lines intersect with the scanning lines to define a plurality of pixel areas, the TFT is configured within the pixel area;

the display substrate further comprises a color film (CF) substrate covering the pixel areas, and the first pixel electrode is arranged on the CF substrate.

7. The display substrate as claimed in claim 6, wherein the display substrate further comprises a second pixel electrode spaced apart from the first pixel electrode, the second pixel electrode is arranged on the CF substrate, and the pixel area comprises an opening area located at one side of the TFT, and the second pixel electrode covers the opening area.

8. The display substrate as claimed in claim 7, wherein the CF substrate is provided with an opening facing toward the source electrode, and the second pixel electrode electrically connects with the source electrode via the opening.

* * * * *